(12) United States Patent
Baumler et al.

(10) Patent No.: US 10,285,311 B2
(45) Date of Patent: May 7, 2019

(54) HIGH ISOLATION GROUNDING DEVICE

(71) Applicant: Cinch Connectivity Solutions, Inc., Bannockburn, IL (US)

(72) Inventors: Robert Joseph Baumler, Waseca, MN (US); Mark Daniel Dvorak, Waseca, MN (US); James Richard Kerekes, Waterville, MN (US)

(73) Assignee: Cinch Connectivity Solutions, Inc., Bannockburn, IL (US)

( * ) Notice: Subject to any disclaimer, the term of this patent is extended or adjusted under 35 U.S.C. 154(b) by 0 days.

(21) Appl. No.: 15/299,975

(22) Filed: Oct. 21, 2016

(65) Prior Publication Data

US 2017/0042070 A1 Feb. 9, 2017
US 2018/0317351 A9 Nov. 1, 2018

Related U.S. Application Data

(63) Continuation of application No. 14/627,177, filed on Feb. 20, 2015, now Pat. No. 9,510,489.

(60) Provisional application No. 61/966,482, filed on Feb. 23, 2014.

(51) Int. Cl.
| | |
|---|---|
| *H05K 9/00* | (2006.01) |
| *H01R 13/03* | (2006.01) |
| *H01R 13/6594* | (2011.01) |
| *H01R 13/6598* | (2011.01) |
| *H01R 24/50* | (2011.01) |

(Continued)

(52) U.S. Cl.
CPC ........... *H05K 9/0064* (2013.01); *H01R 13/03* (2013.01); *H01R 13/6594* (2013.01); *H01R 13/6598* (2013.01); *H01R 24/50* (2013.01); *H05K 1/18* (2013.01); *H05K 9/00* (2013.01); *H05K 9/0066* (2013.01); *H05K 9/0086* (2013.01); *H01R 2103/00* (2013.01); *H05K 2201/0707* (2013.01)

(58) Field of Classification Search
CPC .................................................. H05K 9/0064
USPC ............................................................ 174/51
See application file for complete search history.

(56) References Cited

U.S. PATENT DOCUMENTS

| | | |
|---|---|---|
| 4,421,371 A | 12/1983 | Clark |
| 4,925,403 A | 5/1990 | Zorzy |

(Continued)

FOREIGN PATENT DOCUMENTS

| | | |
|---|---|---|
| DE | 4438872 | 12/1995 |
| DE | 202007008848 | 8/2007 |

(Continued)

OTHER PUBLICATIONS

International Search Report for PCT/US2015/016807, dated May 28, 2015.

(Continued)

*Primary Examiner* — Stanley Tso
(74) *Attorney, Agent, or Firm* — Dentons US LLP; Brian R. McGinley; Roman Tsibulevskiy (57) ABSTRACT

The device includes a body and a plurality of contact portions. The body is substantially planar. The plurality of contact portions are associated with the body so as to form ports. The plurality of contact portions are in electrical communication with the body. The port of each contact portion having an inside diameter substantially equal to ID1. The body and the contact portions are constructed of a conductive metallic material.

17 Claims, 9 Drawing Sheets

(51) Int. Cl.
*H05K 1/18* (2006.01)
*H01R 103/00* (2006.01)

(56) References Cited

U.S. PATENT DOCUMENTS

| | | | |
|---|---|---|---|
| 5,410,104 A * | 4/1995 | Gretz | H01R 13/59 |
| | | | 174/653 |
| 5,577,935 A | 11/1996 | Harting et al. | |
| 5,769,652 A | 6/1998 | Wider | |
| 6,037,846 A | 3/2000 | Oberhammer | |
| 6,441,706 B1 | 8/2002 | Nelson | |
| 6,948,977 B1 | 9/2005 | Behrent | |
| 7,789,721 B1 | 9/2010 | Burdenko | |
| 7,927,125 B1 | 4/2011 | Zieman | |
| 7,934,954 B1 | 5/2011 | Chawgo | |
| 2002/0076978 A1 | 6/2002 | Meyer | |
| 2003/0088242 A1 | 5/2003 | Prakash | |
| 2003/0203677 A1 | 10/2003 | Spiegel et al. | |
| 2006/0096773 A1 | 5/2006 | Cochrance | |
| 2007/0049082 A1 | 3/2007 | Wu | |
| 2007/0111596 A1 * | 5/2007 | Weidner | H01R 9/0515 |
| | | | 439/581 |
| 2009/0093138 A1 | 4/2009 | Benham et al. | |
| 2010/0124854 A1 | 5/2010 | Liu | |
| 2011/0039447 A1 * | 2/2011 | Lai | H01R 13/6582 |
| | | | 439/527 |
| 2012/0108098 A1 * | 5/2012 | Burris | H01R 13/18 |
| | | | 439/345 |
| 2013/0186874 A1 | 7/2013 | Ihde | |
| 2013/0252477 A1 * | 9/2013 | Mcalonis | H01R 13/6453 |
| | | | 439/680 |
| 2014/0209325 A1 * | 7/2014 | Dockweiler | E21B 33/129 |
| | | | 166/382 |
| 2015/0044905 A1 * | 2/2015 | Burris | H01R 9/0524 |
| | | | 439/578 |
| 2015/0168201 A1 | 6/2015 | Cobianu | |
| 2015/0245544 A1 | 8/2015 | Baumler | |

FOREIGN PATENT DOCUMENTS

| | | |
|---|---|---|
| EP | 0339145 A1 | 8/2003 |
| JP | 8-153986 | 6/1996 |
| JP | 2006100521 | 4/2006 |
| JP | 4246682 | 4/2009 |
| JP | 4984896 | 7/2012 |
| KR | 101049171 | 7/2011 |
| KR | 10-1055492 | 8/2011 |

OTHER PUBLICATIONS

Written Opinion of the International Searching Authority for PCT/US2015/016807, dated May 28, 2015.
Supplemental Partial European Search Report for EP 13796518.2, dated Nov. 5, 2015.
European Supplemental Search Report dated Sep. 17, 2015 issued in corresponding EP Application No. 15752878.7 filed Feb. 20, 2015 (8 pgs).
European Search Report dated May 19, 2017 issued in corresponding EP Application No. 16188119.8 filed May 28, 2013 (12 pgs).
European Partial Search Report dated Feb. 17, 2017 issued in corresponding EP Application No. 16188119.8 filed Feb. 20, 2015 (5 pgs).
JP8-153986 Published Jun. 11, 1996, Abstract Only in English, Machine Translation downloaded from EPO (1 pg).
JP2006100521 Published Apr. 13, 2006, Abstract Only in English, Machine Translation downloaded from EPO (1 pg).

* cited by examiner

HIGH ISOLATION GROUNDING DEVICE

CROSS-REFERENCE TO RELATED APPLICATIONS

This application is a continuation of U.S. patent application Ser. No. 14/627,177 filed Feb. 20, 2015, which claims a benefit of priority to U.S. Patent Application 61/966,482 filed on Feb. 23, 2014, all of which are herein fully incorporated by reference for all purposes.

BACKGROUND

1. Field of the Invention

The present invention pertains to devices which reduce electromagnetic interference (EMI). The invention more particularly concerns such a device which is mountable to a printed circuit board (PCB) and which is also engagable with a connector.

2. Discussion of the Background

Devices such as a gasket which is made of an elastomeric material which is impregnated with conductive material are known. Also, electrical connectors which operate in the RF spectrum are known. Typically, the gasket is mounted between the printed circuit board and the electrical connector so as to reduce the amount of electromagnetic radiation which potentially could escape somewhere between the surface of the PCB and the electrical connector. As the number of transmitted electrical signals increases the number of electrical connectors increases. However, in some applications, the amount of space available to accommodate the electrical connectors has not increased. Thus, the density per unit space of connectors is increased. The density can be increased, but the increase in density is limited by how closely the port of one coaxial conductor can be placed adjacent to the port of another coaxial conductor without there being an unacceptable amount of cross-talk or leakage of electromagnetic radiation from one port to another port. The amount of leakage becomes unacceptable when the signal being transported by one of the coaxial conductors is corrupted by the electromagnetic radiation emitted by the other coaxial conductor.

Also known in the art are ganged connectors, such as the connector disclosed in U.S. Pat. No. 7,927,125, which is hereby incorporated herein by reference. This connector has a predefined number of electrical ports that can be accommodated. If the number of desired ports exceeds the number of ports provided on the connector, then another connector must be used or a special connector must be made.

SUMMARY

The invention provides for a device which reduces the amount of electromagnetic radiation emitted between ports of a ganged electrical connector when the ganged electrical connector is connected to a printed circuit board.

In one aspect of the present disclosure, a device is disclosed that includes a planar body, and a plurality of contact portions in electrical association with the body so as to form ports, wherein the body and the plurality of contact portions include a conductive material, e.g., aluminum, beryllium copper, or combinations thereof.

In certain embodiments, each contact portion may include at least one slot.

In certain embodiments, each contact portion may include at least one triangular-shaped section.

Each contact portion has an inside diameter (ID1) and an overall thickness (T1), and the body has an overall thickness (T2).

In certain embodiments, the overall thickness (T2) of the body may be greater than the overall thickness (T1) of each contact portion.

In another aspect of the present disclosure, a device is disclosed that includes a planar body having an overall thickness (T2), and a plurality of contact portions in electrical association with the body so as to form ports, wherein each contact portion has an overall thickness (T1).

The body and the plurality of contact portions include a conductive material, e.g., aluminum, beryllium copper, or combinations thereof.

In certain embodiments, the overall thickness (T2) of the body may be greater than the overall thickness (T1) of each contact portion, whereas in certain other embodiments, the overall thickness (T2) of the body may be equal to the overall thickness (T1) of each contact portion.

In another aspect of the present disclosure, a device is disclosed that is mountable to a printed circuit board, and engagable with a ganged connector, wherein the printed circuit board has a surface, and the ganged connector has at least one boss with a tapered outer wall.

The disclosed device includes a planar body, and a plurality of contact portions in electrical association with the body so as to form ports, wherein each contact portion has an inner wall defining an inside diameter (ID1).

The body and plurality of contact portions include a conductive material, e.g., aluminum, beryllium copper, or combinations thereof.

The device is configured and dimensioned such that, when mounted on the printed circuit board, no air pockets are formed or exist between the device and the printed circuit board.

The ganged connector is configured and dimensioned such that when the ganged connector is introduced toward the printed circuit board, the at least one boss of the ganged connector is introduced into contact with one of the plurality of contact portions. The ganged connector is further configured and dimensioned such that when the ganged connector is introduced into contact with the printed circuit board, the tapered outer wall of the boss contacts the inner wall of one of the ports so that the boss is in electrical communication with the device.

The device has a height which is less than a distance measured between the surface of the printed circuit board and a surface on the ganged connector from which the boss originates.

In certain embodiments, each contact portion may include at least one slot.

In certain embodiments, each contact portion may include at least one triangular-shaped section.

BRIEF DESCRIPTION OF DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF PRESENTLY PREFERRED EMBODIMENTS

Referring now to the drawings, wherein like reference numerals designate identical or corresponding parts through the several views, embodiments of the present invention are displayed therein.

Figure 1:
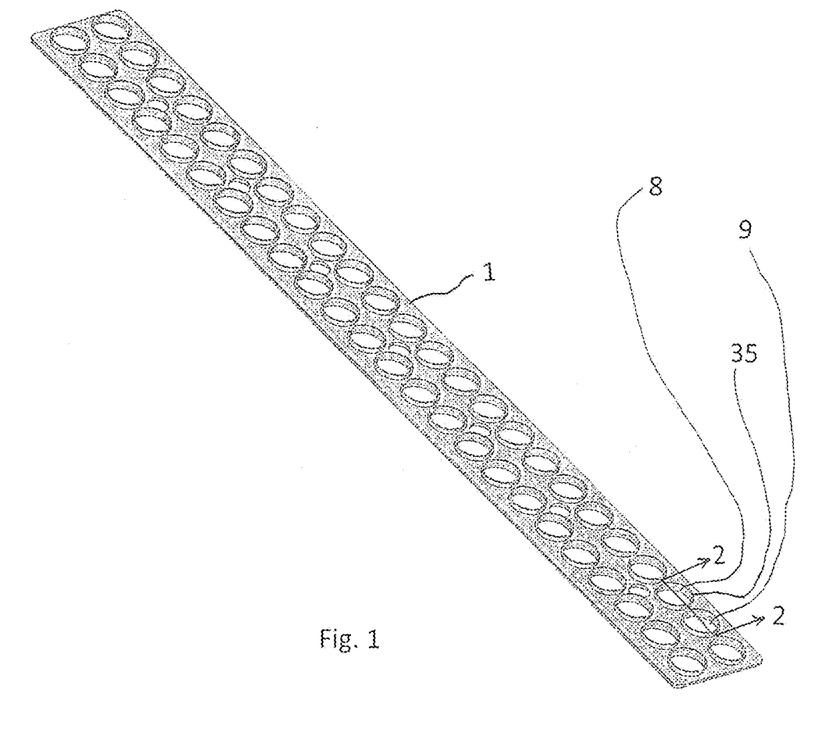
FIG. 1 is a perspective view of a first embodiment of the device of the invention.

FIG. 1 is a perspective view of the first embodiment of the device or EMI gasket 1. The EMI gasket 1 contains forty-eight ports which are arranged in two rows where each row contains twenty-four ports. A first port 8 and a second port 9 are identified. The EMI gasket 1 is constructed of a conductive metallic material such as aluminum or beryllium copper. The EMI gasket 1 includes a contact portion 35 which is shown in conjunction with port 8, but note that each port includes a contact portion. The contact portion 35 can be machined integral with the remainder of the EMI gasket 1 or the contact portions 35 can be joined to the reminder of the EMI gasket by way of welding, brazing, or other joining techniques well known in the art. The contact portion 35 is shown to have a shape of a ring or annulus.

Figure 2:
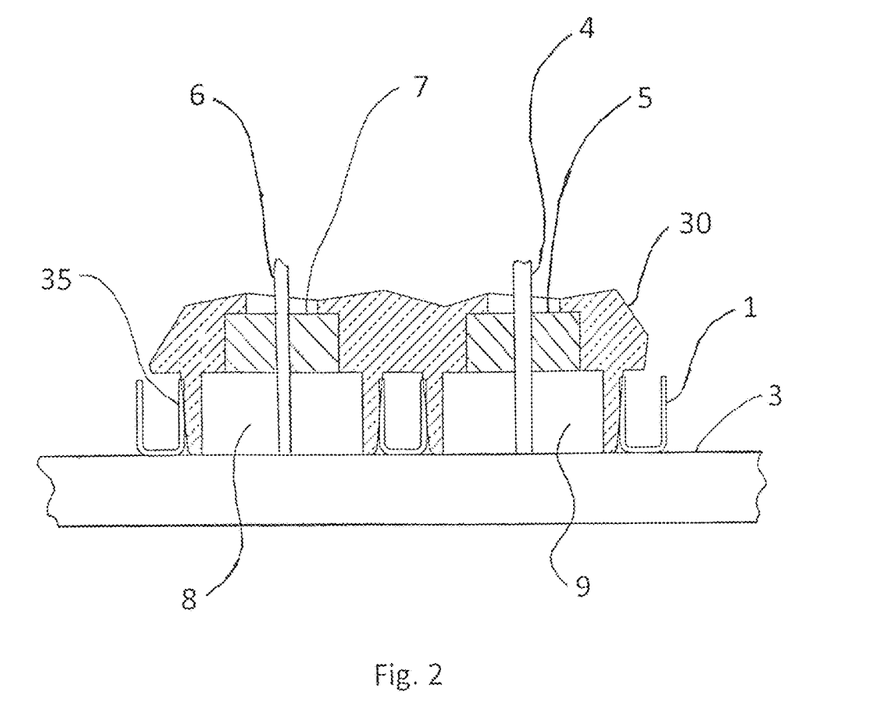
FIG. 2 is a partial cross-sectional side view of the device of FIG. 1, taken along section line 2-2, mounted between a ganged connector and a printed circuit board.

FIG. 2 is a partial cross-sectional side view of the first embodiment of the invention, taken along section line 202 of FIG. 1, where the EMI gasket 1 is soldered to a printed circuit board 3. The EMI gasket 1 is soldered to the printed circuit board 3 so that no air pockets are formed or exist between the EMI gasket 1 and the printed circuit board 3. The EMI gasket 1 is also shown engaged with a ganged connector 30. Further shown are a conductor 6 positioned in port 8, where the conductor 6 is separated from the conductive body of the ganged connector 30 by an insulative spacer 7. Still further shown are a conductor 4 positioned in port 9, where the conductor 4 is separated from the conductive body of the ganged connector 30 by an insulative spacer 5. The engagement of the EMI gasket 1 with the printed circuit board 3 and with the ganged connector 30 prevents an unacceptable level of electromagnetic radiation from entering one port from another port. Thus the signals being carried by conductors 4 and 6 are not corrupted. For reasons of clarity, the EMI gasket 1 is not shown as being cross-hatched, even though the component is section, since the EMI gasket 1 is relatively thin as compared to the other components.

Figure 3:
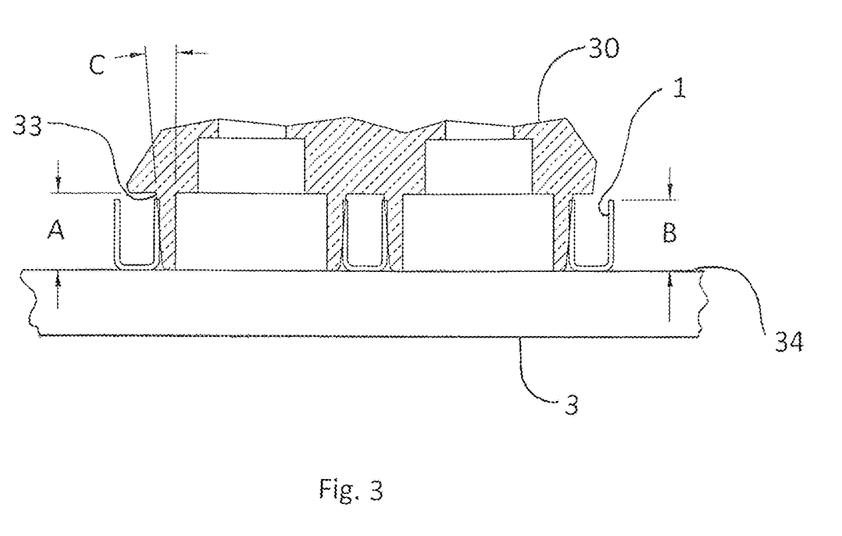
FIG. 3 is the partial cross-sectional side view of FIG. 2, minus the conductors and insulative spacers, which identifies more details of the device of FIG. 1.

FIG. 3 is the partial cross-sectional side view of FIG. 2 without conductors 4, 6 and insulative spacers 5, 7 being shown for reasons of clarity. A boss 33 is shown as projecting from the body of the ganged connector 30. The boss 33 generally has a ring or annular shape. The boss 33 of the ganged connector 30 is shown in contact with a surface 34 of the printed circuit board 3. A boss is associated with each of the port. The outside diameter of the boss 33 is shown to have a draft angle C. A distance A identifies the distance from the surface 34 of the printed circuit board 3 to a surface from which the boss 33 originates out of the body of the ganged connector 30 when the boss 33 contacts the surface 34 of the printed circuit board 3. A distance B identifies a height of the EMI gasket 1. Note that distance A is greater than distance B.

Figure 4:
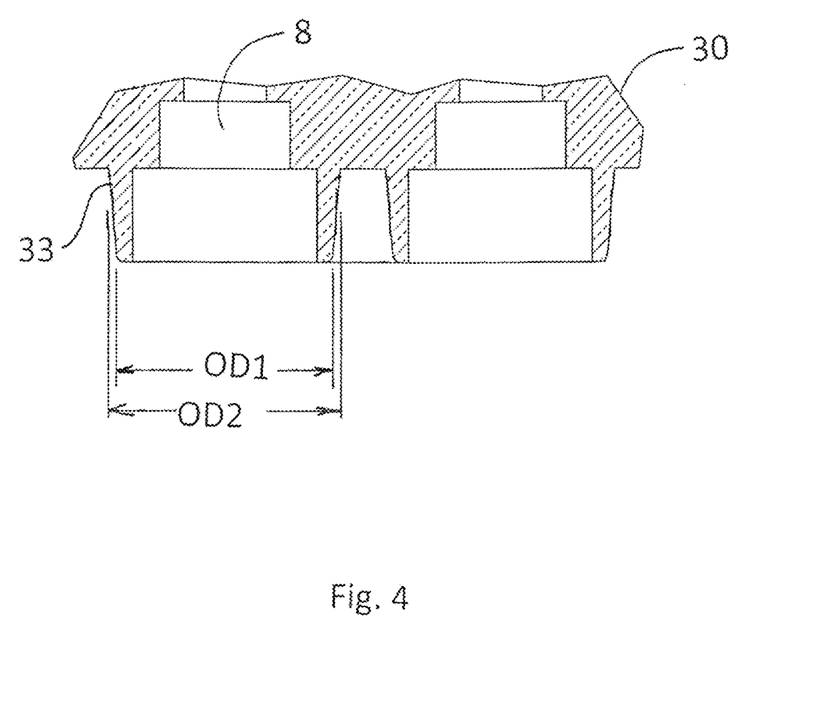
FIG. 4 is a partial cross-sectional side view of the ganged connector of FIG. 2.

FIG. 4 is a partial cross-sectional side view of the ganged connector 30 including boss 33. Identified in FIG. 4 are an outside diameter OD1 of the boss 33 and an outside diameter OD2 of the boss 33 which are associated with port 8. Note that outside diameter OD2 is greater than outside diameter OD1.

Figure 5:
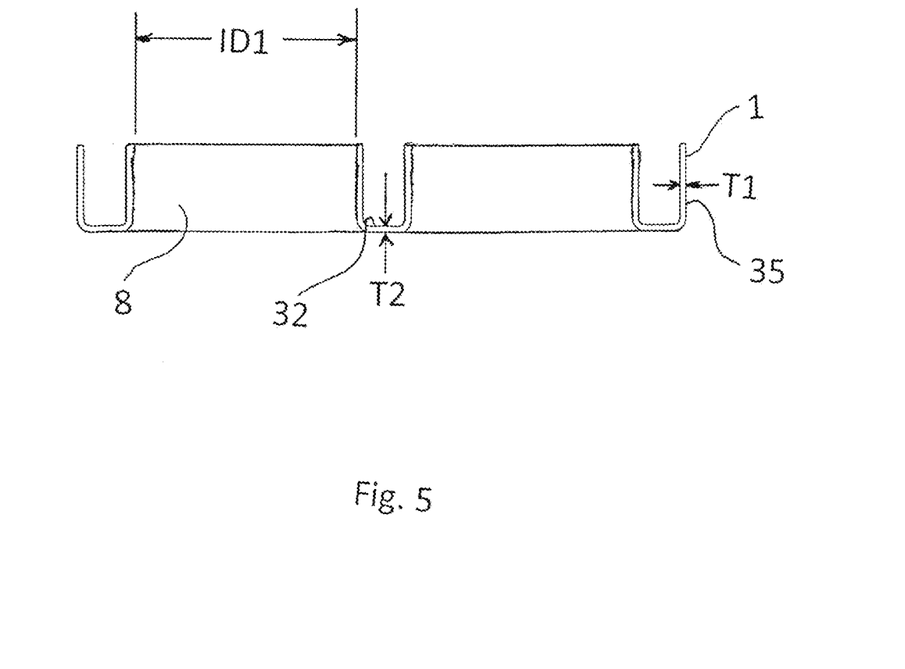
FIG. 5 is a partial cross-sectional side view of the device of the invention as taken from FIG. 2.

FIG. 5 is a partial cross-sectional side view of the EMI gasket 1. The contact portion 35 of the EMI gasket 1 includes an inside diameter ID1 associated with port 8. The contact portion 35 has a thickness T1 and the remainder or body 32 of the EMI gasket 1 has a thickness T2. The inside diameter ID1 of the EMI gasket 1 is greater than the outside diameter OD1 of the boss 33 so that the boss 33 can enter the contact portion 35 of the EMI gasket I. The inside diameter ID1 is less than the outside diameter OD2 of boss 33. So, when the boss 33 is further introduced into the contact portion 35, the outside diameter of the boss 33 engages the contact portion 35, and when the boss 33 and hence the ganged connector 30 are further urged toward the printed circuit board 3 so that the boss 33 contacts the surface 34 of the printed circuit board 3, then a portion of the contact portion 35 is deformed to a larger diameter. Preferably the deformation is elastic. As compared to the contact portion 35, the boss 33 is substantially rigid. When the boss 33 contacts the contact portion 35, then the ganged connector 30 is in electrical communication with the EMI gasket 1, and thus the components are grounded to each other. Thickness T1 is shown as being substantially the same as thickness T2.

However, note that thickness T1 need not be substantially the same as T2. Additionally, dimension B which identifies the height of the EMI gasket 1 can be substantially different than as shown in FIG. 2. If the deformation is elastic, then the gang connector 30 can be mounted and de-mounted to the EMI gasket 1 more than once. Additionally, it has been found that adequate isolation can be achieved even if the boss 33 does not contact the surface 34 of the printed circuit board 3, but it must be close. However, it is preferable that the boss 33 does contact the surface 34 of the printed circuit board 3.

Figure 6:
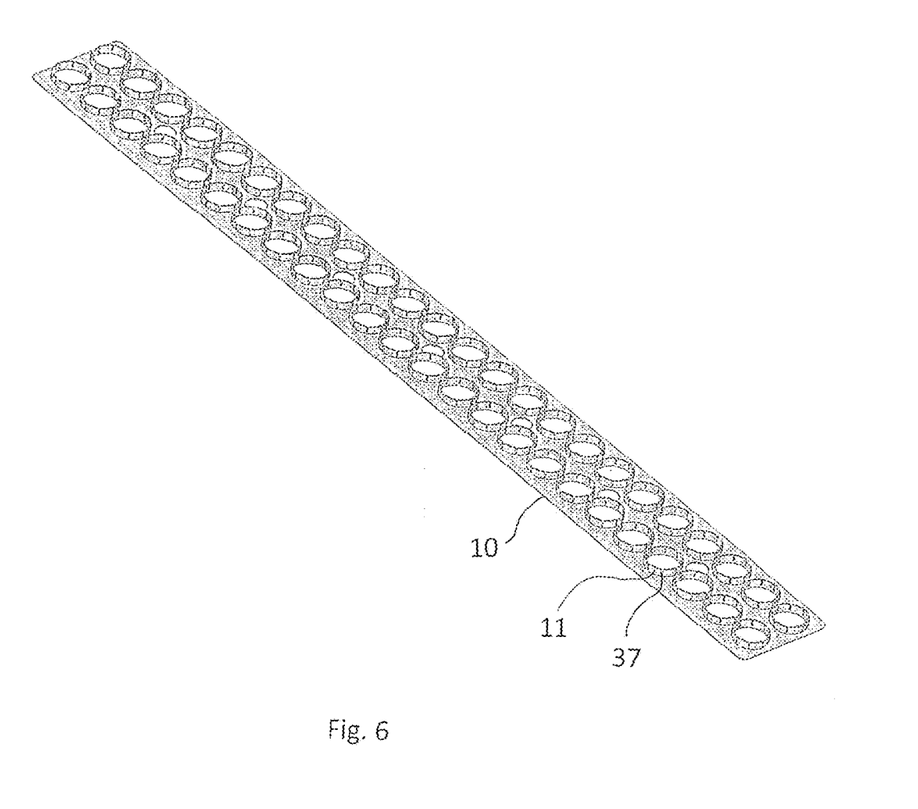
FIG. 6 is a perspective view of a second embodiment of the invention.

FIG. 6 a perspective view of a second embodiment of the invention which is an EMI gasket 10 having a contact portion 11 which includes slots 37 in the contact portion 11. Otherwise, EMI gasket 10 is substantially similar to EMI gasket 1.

Figure 7:
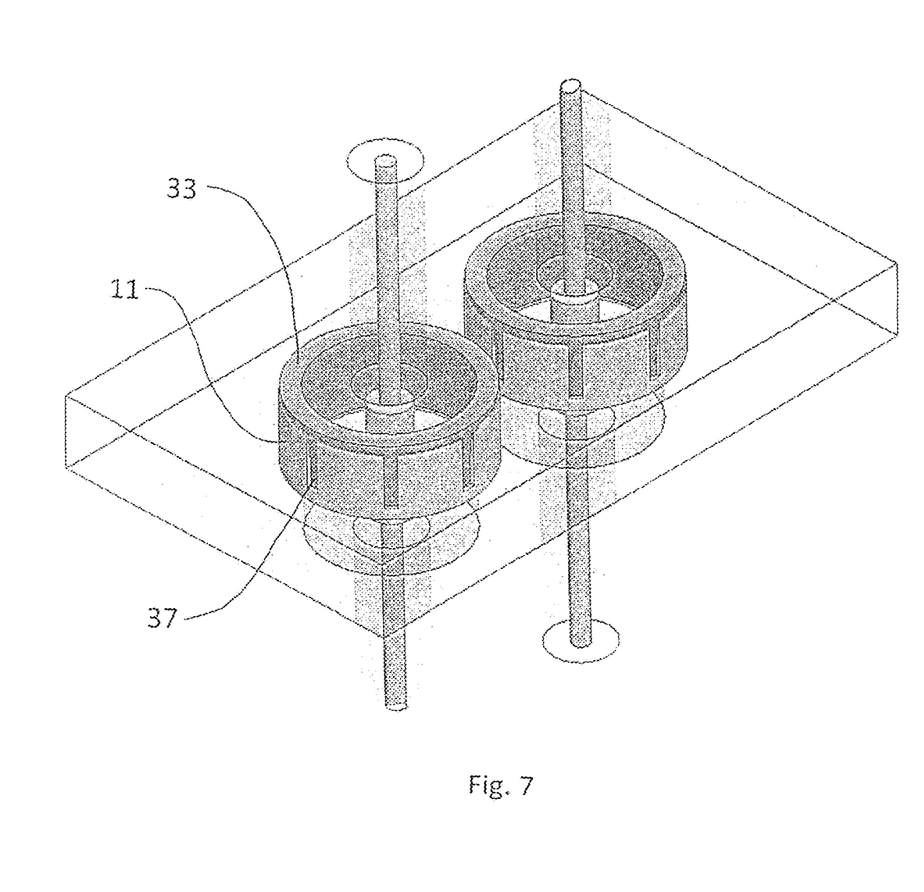
FIG. 7 is a partial perspective view of the second embodiment of the invention as it engages the ganged connector.

FIG. 7 is a partial perspective view of the contact portion 11, including the slots 37, of EMI gasket 10 engaged with boss 33. The slotted contact portion 11 allows for more flexibility of the contact portion 11 as compared to the contact portion 35 that does not include slots, yet the EMI gasket 10 still provides for adequate reduction of electromagnetic interference between adjacent ports of the ganged connector 30.

Figure 8:
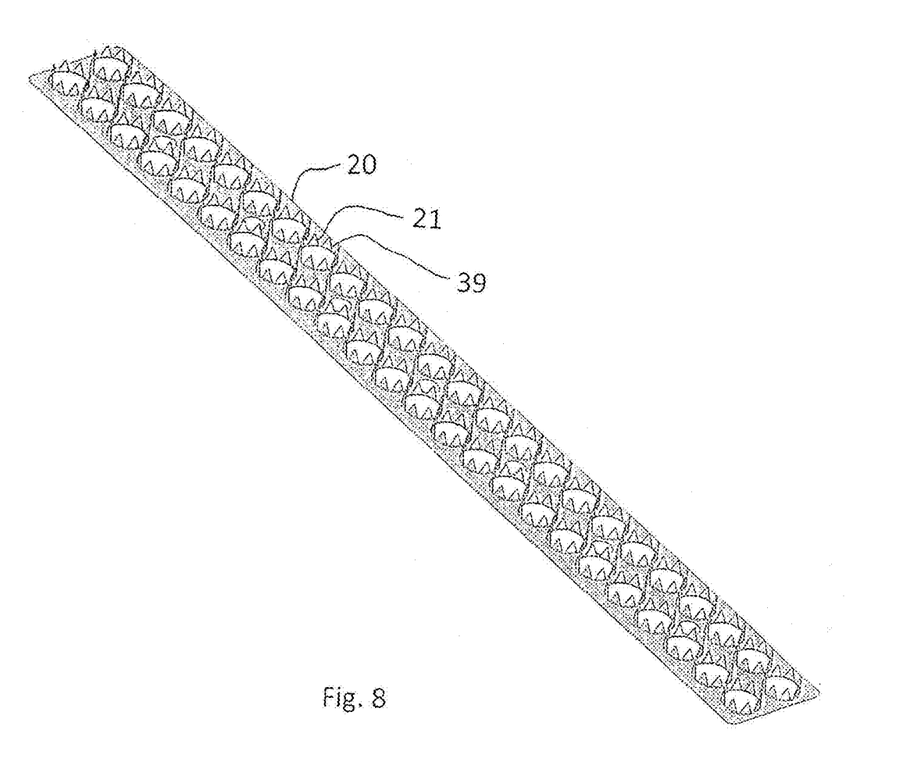
FIG. 8 is a perspective view of a third embodiment of the invention.

FIG. 8 is a perspective view of a third embodiment of the invention which is an EMI gasket 20 having a contact portion 39 which includes triangular-shaped sections 21. Otherwise, EMI gasket 20 is substantially similar to EMI gasket 1.

Figure 9:
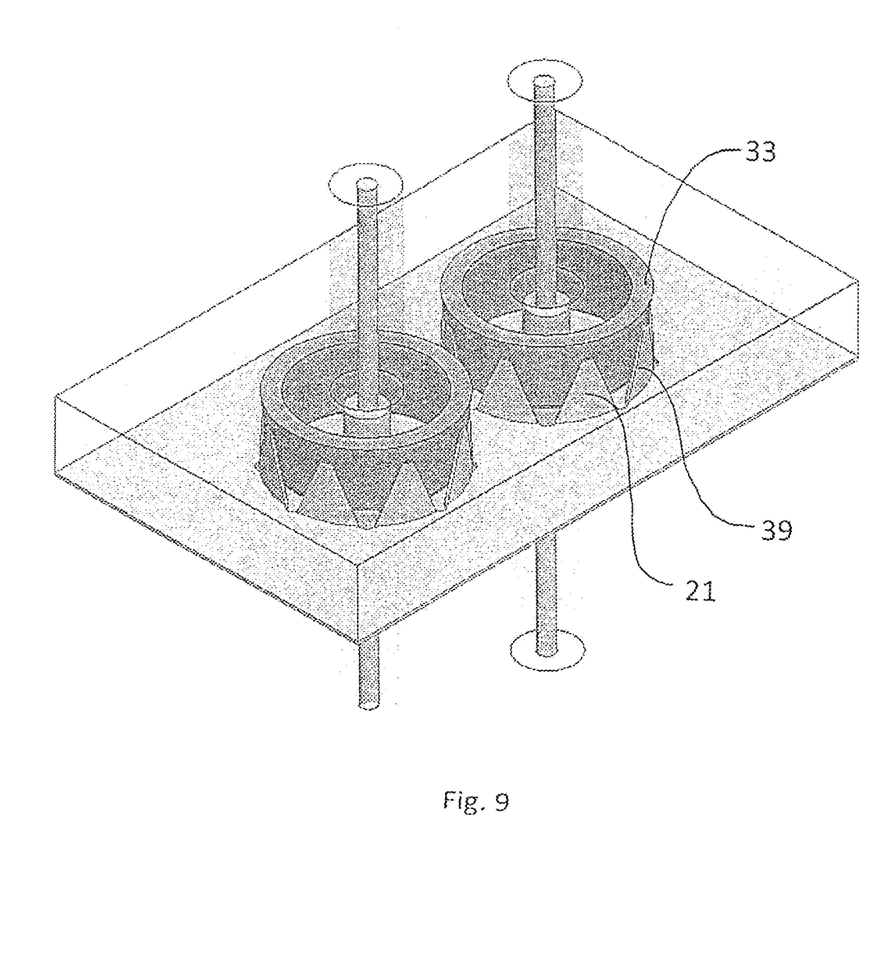
FIG. 9 is a partial perspective view of the third embodiment of the invention as it engages the ganged connector.

FIG. 9 is a partial perspective view of the contact portion 39, including the triangular-shaped sections 21, of EMI gasket 20 engaged with boss 33. The contact portion 39, including the triangular-shaped sections 21, allows for more flexibility of the contact portion 39 as compared to the contact portion 35 that does not include triangular-shaped sections, yet the EMI gasket 20 still provides for adequate reduction of electromagnetic interference between adjacent ports of the ganged connector 30.

Obviously, numerous modifications and variations of the present invention are possible in light of the above teachings. For example, persons skilled in the art will understand that additional components and features may be added to any of the embodiments discussed herein above without departing from the scope of the present disclosure. It is therefore to be understood that within the scope of appended claims, the invention may be practiced otherwise than as specifically described herein.

The scope of the present disclosure is intended to cover any variations, uses, or adaptations of the presently disclosed subject matter in accordance with the principles of the present disclosure, including such departures from the present disclosure as come within known or customary practice within the art to which the present disclosure pertains and as may be applied to the essential features herein before set forth. Further, it is envisioned that any feature described in connection with any one embodiment may also be applicable to, or combined with, any other embodiment.

What is claimed is:

1. A device comprising:
   a gasket mountable to a printed circuit board and engagable with a ganged connector having a boss with a tapered outer wall, wherein the printed circuit board includes a board surface, wherein the gasket including:
   a body which is conductive, linear, and planar, and
   a row of ports extending on the body longitudinally, wherein at least one of the ports includes a contact portion extending in a closed shape, wherein the contact portion is conductive and in electrical communication with the body, wherein the closed shape includes a pair of wall portions and a slot, wherein the slot is positioned between the pair of wall portions, wherein the contact portion having an inner wall defining an inside diameter having a longitudinal axis about which the inside diameter is centered, wherein the longitudinal axis is perpendicular to the body, wherein the contact portion is associated with only one respective port, wherein the inside diameter is constant along a length of the inner wall, wherein no air pockets are formed or exist between the body and the printed circuit board and the longitudinal axis of the contact portion is perpendicular to the printed circuit board when the body is mounted on the printed circuit board, wherein the boss directly contacts the contact portion when the ganged connector is moved toward the printed circuit board, wherein the tapered outer wall contacts the inner wall such that the boss is in electrical communication with the body as the ganged connector contacts the printed circuit board and the boss is in direct contact with the board surface, wherein the body having a height which is less than a distance measured between the printed circuit board and a connector surface on the ganged connector from which the boss originates.

2. The device of claim 1, wherein the slot includes an open end distal to the body.

3. The device of claim 1, wherein the closed shape includes a triangular-shaped section.

4. The device of claim 3, wherein the triangular-shaped section includes a base portion and a peak portion, wherein the base portion is longer than the peak portion, wherein the base portion opposes the peak portion, wherein the base portion is proximal to the body, wherein the peak portion is distal to the body.

5. The device of claim 1, wherein the closed shape encloses the boss, wherein the contact portion engages the boss.

6. The device of claim 1, wherein at least two of the ports include the contact portion.

7. The device of claim 6, wherein the at least two ports are consecutive.

8. The device of claim 1, wherein the contact portion is deformable.

9. The device of claim 8, wherein the contact portion is elastic.

10. The device of claim 1, wherein the body is rectilinear.

11. The device of claim 1, wherein the body is constructed from a first material, wherein the contact portion is constructed from a second material, wherein the first material and the second material is a single material.

12. The device of claim 1, wherein the body is constructed from a first material, wherein the contact portion is constructed from a second material, wherein the first material and the second material are distinct materials.

13. A gasket mountable to a printed circuit board and engagable with a ganged connector, the printed circuit board having a board surface, the ganged connector having a boss with a tapered outer wall, the gasket comprising:
   a planar and linear body; and
   a plurality of contact portions in electrical association with the body so as to form a plurality of ports, wherein the contact portions each having an inner wall defining an inside diameter and the inside diameter having a longitudinal axis about which the inside diameter is centered and where the longitudinal axis is perpendicular to the body, wherein each of the contact portions is associated with only one respective port of the ports, and where, in an undeformed state of the contact portion, the inside diameter is constant along a length of the inner wall, wherein the body and the contact portions include a conductive material, wherein the body is configured such that, when the body is mounted on the printed circuit board, no air pockets are formed or exist between the body and the printed circuit board and that the longitudinal axis of the inside diameter of each of the contact portions is perpendicular to the board surface, wherein the ganged connector is configured such that, when the ganged connector is introduced toward the printed circuit board, the boss of the ganged connector is introduced into direct contact with one of the contact portions, wherein each of the contact portions includes a plurality of annular-shaped sections, wherein each of the annular-shaped sections extends to form a closed shape, wherein the ganged connector is configured such that as the ganged connector is introduced into contact with the printed circuit board, the tapered outer wall of the boss contacts the inner wall of one of the ports so that the boss is in electrical communication with the body and the boss is in direct contact with the board surface, the body having a height which is less than a distance measured between the board surface of the printed circuit board and a connector surface on the ganged connector from which the boss originates.

14. A device comprising:
a gasket including:
 a body which is conductive, linear, and planar; and
 a row of ports extending on the body longitudinally, wherein at least one of the ports includes a contact portion extending in a closed shape and in electrical communication with the body, wherein the closed shape includes a pair of wall portions and a slot, wherein the slot is positioned between the pair of wall portions, wherein the slot includes an open end distal to the body, wherein no air pockets are at least one of formed or exist between the body and a circuit board when the body is mounted to the circuit board, wherein the port is perpendicular to the circuit board when the body is mounted to the circuit board, wherein the contact portion directly contacts a boss of a ganged connector when the ganged connector is moved toward the circuit board such that the boss directly contacts the circuit board, wherein the contact portion directly contacts the boss such that the boss is in electrical communication with the body as the ganged connector contacts the circuit board.

15. The device of claim 14, wherein the slot is at least one of triangular or rectangular in shape.

16. The device of claim 15, wherein the contact portion is deformable.

17. The device of claim 16, wherein the contact portion is elastic.

* * * * *